United States Patent

Ishiyama et al.

[11] Patent Number: 5,694,241
[45] Date of Patent: Dec. 2, 1997

[54] CATADIOPTRIC REDUCTION PROJECTION OPTICAL SYSTEM AND EXPOSURE APPARATUS EMPLOYING THE SAME

[75] Inventors: Toshiro Ishiyama, Kawasaki; Yutaka Suenaga, Yokohama, both of Japan

[73] Assignee: Nikon Corporation, Japan

[21] Appl. No.: 577,280

[22] Filed: Dec. 22, 1995

[30] Foreign Application Priority Data

Jan. 30, 1995 [JP] Japan .................................. 7-012502

[51] Int. Cl.$^6$ ............................ G02B 17/00; G02B 21/00
[52] U.S. Cl. ........................................ 359/364; 359/727
[58] Field of Search ............................ 359/364, 365, 359/366, 726, 727, 730, 732, 733

[56] References Cited

U.S. PATENT DOCUMENTS

| | | | |
|---|---|---|---|
| 4,747,678 | 5/1988 | Shafer | 359/366 |
| 4,953,960 | 9/1990 | Williamson | 359/663 |
| 5,052,763 | 10/1991 | Singh | 359/355 |
| 5,212,593 | 5/1993 | Williamson et al. | 359/727 |
| 5,289,312 | 2/1994 | Hashimoto et al. | 359/727 |
| 5,323,263 | 6/1994 | Schoenmakers | 359/366 |

*Primary Examiner*—Paul M. Dzierzynski
*Assistant Examiner*—Mark Robinson
*Attorney, Agent, or Firm*—Pennie & Edmonds LLP

[57] ABSTRACT

A catadioptric reduction projection optical system having a structure capable of increasing a numerical aperture without increasing the size of a beam splitter and achieves excellent performance of a semiconductor manufacturing apparatus. The catadioptric reduction projection optical system comprises a first partial optical system having a first lens group, the beam splitter, a lens element, and a concave reflecting mirror to form an intermediate image of a first object, a second partial optical system for forming a reduced image of the intermediate image on a second object, the second partial optical system having a second lens group of a positive refracting power and arranged in an optical path between a second object surface and a surface on which the intermediate image is formed, and a third lens group arranged in an optical path between the beam splitter and the third lens group. The first lens group is arranged in an optical path between the first object and the beam splitter. Light from the first object guided to the concave reflecting mirror through the first lens group, the beam splitter, and the second lens group in the order named. Light reflected by the concave reflecting mirror passes through the second lens group and the beam splitter in the order named and is guided to the surface on which the intermediate image is formed. At least a part of the fourth lens group is arranged in an optical path between the beam splitter and the surface.

22 Claims, 8 Drawing Sheets

CATADIOPTRIC REDUCTION PROJECTION OPTICAL SYSTEM AND EXPOSURE APPARATUS EMPLOYING THE SAME

BACKGROUND OF THE INVENTION

1. Field of the Invention

The present invention relates to a catadioptric optical system having reflecting and refracting surfaces and, more particularly, to an imaging optical system for performing reduction projection. The present invention also relates to an exposure apparatus employing a catadioptric optical system as a projection optical system.

2. Related Background Art

A variety of conventional optical systems for projecting and exposing mask patterns on photoresists on wafers in the manufacture of integrated circuits such as LSIs have been proposed. For example, a Dyson catadioptric optical system is known to properly correct aberrations in a relatively large numerical aperture. The Dyson catadioptric optical system, however, has limitations in transfer of micropatterns because the imaging magnification is x1.

Optical systems as modifications of the Dyson catadioptric optical system are proposed as optical systems having reduction magnifications suitable for the manufacture of micropatterned semiconductor devices, as disclosed in U.S. Pat. Nos. 4,747,678 and 4,953,960.

The optical system capable of performing reduction projection, as disclosed in U.S. Pat. No. 4,747,678 can perform imaging with an annular visual field at a reduction magnification. This optical system basically has three concave mirrors and one convex mirror. To use it as a microlithography exposure apparatus, a large number of lenses are combined to result in a complicated structure. The structure of this optical system cannot increase the numerical aperture because optical paths complicatedly reciprocate.

The reduction optical system proposed in U.S. Pat. No. 4,953,960 has an arrangement as a combination of one concave reflecting mirror, a lens system, and a beam splitter. In this reduction optical system, an increase in numerical aperture results in a great increase in volume of the beam splitter itself because the beam splitter is located near the pupil plane of the optical system.

SUMMARY OF THE INVENTION

It is an object of the present invention to realize a catadioptric reduction projection optical system having a structure capable of relatively reducing the volume of a beam splitter and obtaining a large numerical aperture, and apply this catadioptric reduction projection optical system to obtain a semiconductor manufacturing apparatus excellent in performance.

The catadioptric reduction projection optical system according to the present invention can be applied to any one of a one-shot exposure apparatus and a scanning exposure apparatus. As shown in FIG. 1, an exposure apparatus to which this catadioptric reduction projection optical system is applied has at least a first stage WS (wafer stage) on which a photosensitive substrate W (e.g., a silicon wafer having a surface coated with a photoresist) on a main surface WSa of the first stage, a second stage RS (reticle stage) for holding a mask R (e.g., a reticle) having a predetermined pattern, and an illumination optical system IS for irradiating exposure light having a predetermined wavelength on the mask R to transfer the pattern of the mask R onto the substrate. An excimer laser is used as an exposure light source 100 in the exposure apparatus. The catadioptric reduction projection optical system of the present invention is arranged between an object surface P1 (first surface) on the mask (first object) and an image surface P2 (second surface) on the substrate (second object). This optical system projects a reduced image of the mask pattern on the first surface P1 onto the second surface P2 on the substrate W.

The catadioptric reduction projection optical system according to the present invention comprises a beam splitter BS for splitting light from the object surface P1 on the mask R. The optical system also comprises a first partial optical system for forming an intermediate image I of the object surface P1 on a surface P3 and a second partial optical system for forming the reduced image of the intermediate image I onto the image surface P2 on the substrate W. The second partial optical system comprises a third lens group $G_3$ located in an optical path between the surface P3 and the image surface P2, and a third lens group $G_3$ having a positive refracting power. This optical system also comprises a fourth lens group $G_4$ located in the optical path between the beam splitter BS of the first partial optical system and the third lens group $G_3$ of the second partial optical system.

The first optical system comprises a first lens group $G_1$, the beam splitter BS, a lens element $G_2$, and a concave reflecting mirror $M_1$. These optical elements are arranged to perform the following operations. Light from the object surface P1 is passed through the first lens group $G_1$, the beam splitter BS, and the lens element $G_2$ in the order named and is guided to the concave reflecting mirror $M_1$. In addition, the light reflected by the concave reflecting mirror $M_1$ is passed through the lens element $G_2$ and the beam splitter BS in the order named and is focused to form the intermediate image I. The exposure apparatus to which the catadioptric reduction projection optical system having this arrangement is applied has a resolution of submicron order in a wavelength of 300 nm below.

In particular, in the first partial optical system, the first lens group $G_1$ is located in the optical path between the object surface P1 and the beam splitter BS. As an arrangement example, as shown in FIGS. 3 and 4, a lens surface $S_2$ of the lens element $G_2$, being closest to the beam splitter side, faces a lens surface $S_4$ of the fourth lens group $G_4$, being closest to the beam splitter side. Alternatively, in the first partial optical system, as shown in FIG. 5, while the first lens group $G_1$ is located in the optical path between the object surface P1 and the beam splitter BS, a lens surface $S_1$ of the first lens group $G_1$, being closest to the beam splitter side, may face the lens surface $S_2$ of the lens element $G_2$, being closest to the beam splitter side. In the embodiments shown in FIGS. 3, 4 and 5, the lens surface $S_2$ has a concave shape with respect to the beam splitter BS, and the lens surface $S_1$ has a concave shape with respect to the beam splitter BS.

According to the present invention, "light passes through the beam splitter BS" indicates that light is transmitted through the beam splitter BS or reflected by a beam splitting surface BSa (direction changing surface) of the beam splitter BS.

According to the present invention having the above constitution, the intermediate image I of the pattern of the object surface P1 is formed by the first partial optical system serving as a catadioptric optical system, and the intermediate image I is focused on the image surface P2 again by the second partial optical system serving as a refraction optical system at a reduction magnification. The aberration correction loads on the respective partial optical systems can be reduced, and excellent optical characteristics can be obtained in the overall system. In addition, since the first partial optical system causes the beam splitter BS to split light into light incident on the concave reflecting mirror $M_1$ and light reflected from the concave reflecting mirror $M_1$, the diameter of each optical element can be reduced as compared with the size of the exposure field.

The first lens group $G_1$ in the first partial optical system is located a position closest to the object side (reticle side) to assure telecentric properties on the object side and has a function of correcting off-axial aberrations. The concave reflecting mirror $M_1$ has a function of imparting a main refracting power for forming the intermediate image I of the object. The lens element $G_2$ is located near the concave reflecting mirror $M_1$ and has a function of correcting a spherical aberration occurring at the concave reflecting mirror $M_1$.

Furthermore, the beam splitter BS has a function of guiding light incident through the first lens group $G_1$ to the concave reflecting mirror $M_1$ through the lens element $G_2$ and at the same time guiding the light reflected by the concave reflecting mirror $M_1$ and incident through the lens element $G_2$ again to a position (surface P3) where the intermediate image I is formed. In this case, since the beam splitter BS is arranged at a position relatively far away from the pupil position of the optical system in the present invention, the beam splitter BS can be prevented being bulky even in realization of a large numerical aperture.

The fourth lens group $G_4$ located in the optical path between the first partial optical system and the second partial optical system is located near the position where the intermediate image I is formed, and has a function of controlling correction of off-axial aberrations. Therefore, at least a part (optical member) of the fourth lens group $G_4$ is arranged between the beam splitter and the surface P3. The aberration correction loads on the third lens group $G_3$ (included in the second partial optical system) having the function of obtaining the reduced image of the intermediate image I can be reduced.

This catadioptric reduction projection optical system is preferably arranged to satisfy the following condition:

$$-4.0 < \beta_{Pl}/\beta < -2.5 \qquad (1)$$

where $\beta$ is the reduction magnification of the overall system, and $\beta_{Pl}$ is the transverse magnification of the intermediate image I.

Condition (1) defines appropriate magnifications (transverse magnifications) in the first and second partial optical systems. That is, the first and second partial optical systems perform focusing at the reduction magnifications, respectively. For this reason, a predetermined magnification for the overall system can be obtained without overloading the first and second partial optical systems in aberration correction. In addition, since the beam splitter BS is located at a position far away from the pupil position of one of first and second partial optical systems which has a larger numerical aperture, the beam splitter BS can be made more compact.

When the transverse magnification exceeds the upper limit of condition (1), the magnification of the first partial optical system becomes larger than that of the second partial optical system, and the refracting power of the concave reflecting mirror $M_1$ generally becomes high. This is undesirable because it becomes difficult to correct the spherical aberration and the Petzval's sum. More preferably, the upper limit of condition (1) is set to −3.2 to satisfy condition $-3.2 > \beta_{Pl}/\beta$.

When the transverse magnification exceeds the lower limit of condition (1), the intermediate image I becomes an enlarged image with respect to the object (reticle). The second partial optical system is overloaded, and aberration correction becomes more difficult, resulting in inconvenience.

The optical system of the present invention is arranged to preferably satisfy the following condition:

$$-3.2 < \beta_{M1}/\beta < -2.8 \qquad (2)$$

where $\beta$ is the reduction magnification of the overall system, and $\beta_{M1}$ is the transverse magnification of the concave reflecting mirror $M_1$.

Condition (2) defines an appropriate magnification of the concave reflecting mirror $M_1$. When the transverse magnification exceeds the upper limit of condition (2), the refracting power of the concave reflecting mirror $M_1$ is increased, and it becomes difficult to correct the spherical aberration and the Petzval's sum. More preferably, the upper limit of condition (2) is set to −3.2 to satisfy condition $-3.2 > \beta_{M1}/\beta$.

When the transverse magnification is smaller than the lower limit of condition (2), the magnification of the concave reflecting mirror $M_1$ excessively increases, and the load for obtaining a reduction magnification in the refraction optical element undesirably increases. This is not preferable because the load for aberration correction increases.

The fourth lens group $G_4$ is preferably arranged to have a positive refracting power. The spread of the beam guided to the third lens group $G_3$ can be controlled, and the diameter of the third lens group $G_3$ can be reduced.

The refracting power of the first lens group $G_1$ is preferably positive. The beam passing through the first lens group $G_1$ is not excessively spread and can reach the beam splitter BS. Therefore, the beam splitter BS can be made more compact.

An aperture stop AS is preferably arranged in the third lens group $G_3$ included in the second partial optical system. A re-imaging optical system for forming an intermediate image generally has a plurality of positions at which an aperture stop can be located, and any one of the positions can be selected. In the present invention, the intermediate image I is formed by the first partial optical system, and this intermediate image I is refocused by the second partial optical system to obtain a reduced image having a predetermined magnification in the overall system. More specifically, at least one aperture stop position is included in each partial optical system. However, when an aperture stop is to be arranged in the first partial optical system, it is difficult to arrange the aperture stop in the optical path between the concave reflecting mirror $M_1$ and the beam splitter BS because the beam reciprocates along this optical path. In consideration of assurance of the telecentric properties and the radial sizes of optical elements (e.g., a lens, a reflecting mirror, and a beam splitter), the aperture stop is preferably arranged very near the concave reflecting mirror $M_1$ in the first partial optical system. In this case, the degree of freedom in optical design is undesirably reduced to result in a difficulty in mechanical design.

On the other hand, due to the absence of the above difficulty, the aperture stop AS can be preferably arranged in the third lens group $G_3$ included in the second partial optical system.

When irradiation is performed using a light source 100 such as an excimer laser having a wavelength of 300 nm or less, each optical member constituting the first to fourth lens groups preferably consists of a glass material selected from one of silica glass and fluorite. With this arrangement, chromatic aberration correction can be performed in a relatively wide range. When the second partial optical system comprises only refraction optical elements, at least one of the negative lenses for correcting the on-axis chromatic aberration preferably consists of silica glass, and one of the positive lenses preferably consists of fluorite.

The catadioptric reduction projection optical system of the present invention satisfies the following condition when the focal length of the lens element $G_2$ is defined as $f_{G2}$:

$$f_{G2} < 0 \tag{3}$$

Condition (3) defines an appropriate focal length of the lens element $G_2$. When the focal length of the lens element $G_2$ falls outside the range of condition (3), it is undesirably difficult to correct the spherical aberration caused by the concave reflecting mirror $M_1$.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

Figure 1:
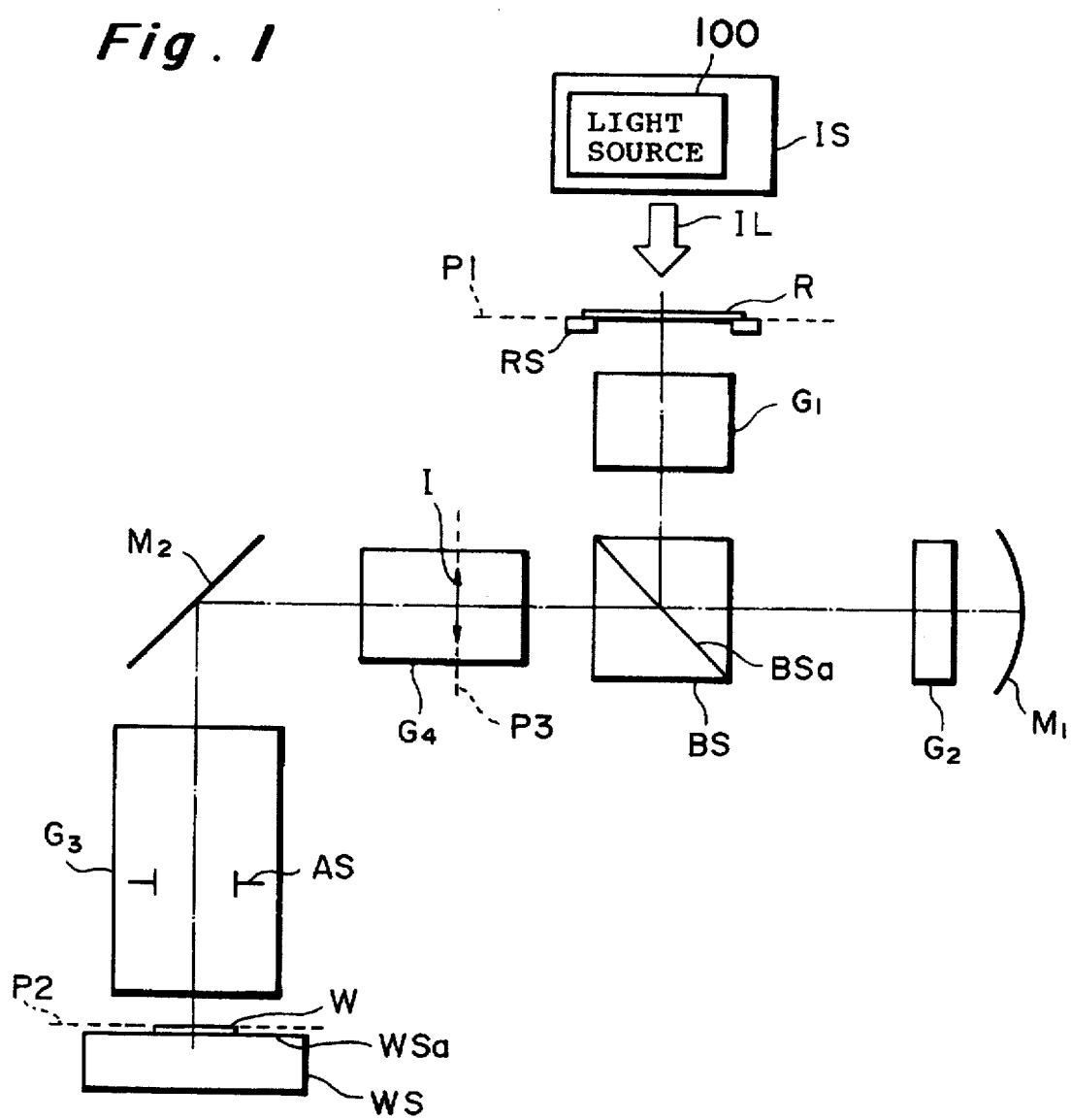
FIG. 1 is a view showing the schematic arrangement of an exposure apparatus which can employ a catadioptric reduction projection optical system according to the present invention.

Preferred embodiments of the present invention will be described blow. FIG. 1 is a view showing the schematic arrangement of an exposure apparatus which employs a catadioptric reduction projection optical system according to the present invention.

As will be briefly described with reference to FIG. 1, a reticle R (first object) having a predetermined circuit pattern thereon is placed on a reticle stage RS, as shown in FIG. 1. An illumination optical system IS for uniformly illuminating the reticle R is arranged above the reticle R. The illumination optical system IS includes an excimer laser as a light source 100. Light (light from an object surface P1) from the reticle R uniformly illuminated with light from the illumination optical system IS passes through a first lens group $G_1$ and is reflected by a beam splitting surface BSa of a beam splitter BS. The reflected light reaches a concave reflecting mirror $M_1$ through a lens element $G_2$. The light reflected by the concave reflecting mirror $M_1$ passes through the lens element $G_2$ again and is incident on a fourth lens group $G_4$ through the beam splitter BS. An intermediate image I (primary image) of the reticle R is formed on a surface P3 by the first and lens element $G_1$ and $G_2$, the concave reflecting mirror $M_1$, and the beam splitter BS.

Light from the intermediate image I of the reticle R emerges from the fourth lens group $G_4$ and is reflected by an optical path deflection mirror $M_2$. The reflected light is then incident on a third lens group $G_3$. In this embodiment, an aperture stop AS is arranged in the third lens group $G_3$. The position of the aperture stop AS corresponds to the pupil position of the overall catadioptric optical system. In this embodiment, an image of the light source 100 of the illumination optical system IS is formed at the position of the aperture stop AS. That is, the illumination optical system performs Koehler illumination.

The light emerging from the third lens group $G_3$ is focused to form a final image (secondary image) of the reticle R on an image surface P2 on the photosensitive substrate W (second object) placed on a wafer stage WS. The magnification of the secondary image of the reticle R is a reduction magnification. In the arrangement shown in FIG. 1, the optical path deflection mirror $M_2$ is arranged between the fourth and third lens groups $G_4$ and $G_3$ to set the reticle R and the substrate W (to be referred to as a wafer hereinafter) parallel to each other. However, the optical path deflection mirror $M_2$ may be arranged at an arbitrary position from the viewpoint of optical design.

Figure 2:
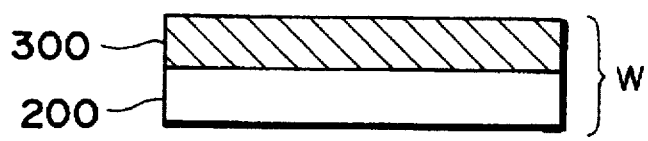
FIG. 2 is a sectional view showing the structure of a photosensitive substrate.

FIG. 2 shows the sectional structure of the photosensitive substrate or wafer W. This photosensitive substrate is obtained by coating the surface of an exposure target 200 such as a silicon wafer or a glass plate with a photosensitive material 300 such as a photoresist.

Techniques associated with the above exposure apparatus are disclosed in, e.g., U.S. Ser. No. 08/25,927now U.S. Pat. No. 5,534,970, 08/260,398, now U.S. Pat No. 5,591,958 and 08/299,305, now U. S. Pat. No. 5,506,684, and U.S. Pat. Nos. 4,497,015, 4,666,273, 5,194,893, 5,253,110, 5,333,035, and 5,379,091. An exposure apparatus disclosed in each of the above references can be applied to the reflection/refraction optical system according to the present invention.

The U.S. Ser. No. 08/255,927 now U.S. Pat. No. 5,534,490 describes an illumination optical system (using a laser source) applicable to a scanning exposure apparatus. U.S. Ser. No. 08/260,398 now U.S. Pat. No. 5,591,958 describes an illumination optical system (using a lamp source) applicable to a scanning exposure apparatus. U.S. Ser. No. 08/299,305 now U.S. Pat. No. 5,506,684 discloses an alignment optical system applicable to a scanning exposure apparatus. U.S. Pat. No. 4,497,015 describes an illumination optical system (using a lamp source) applicable to a general exposure apparatus. U.S. Pat. No. 4,666,273 discloses an example of a step-and-repeat exposure apparatus. U.S. Pat. No. 5,194,893 discloses a scanning exposure apparatus, and particularly, an illumination optical system, an illumination area, a mask-side interference system, a reticle-side interference system, an automatic focusing mechanism, and an alignment optical system. U.S. Pat. No. 5,253,110 describes an illumination optical system (using a laser source) applied to a step-and-repeat exposure apparatus. The illumination optical system disclosed in this reference can also be applied to a scanning exposure apparatus. U.S. Pat. No. 5,333,035 discloses a modified illumination optical system applied to a general exposure apparatus. U.S. Pat. No. 5,379,091 discloses an illumination optical system (using a laser source) applied to a scanning exposure apparatus.

The catadioptric reduction projection optical systems according to the respective preferred embodiments of the present invention will be described with reference to FIGS. 3 to 5.

First Embodiment

Figure 3:
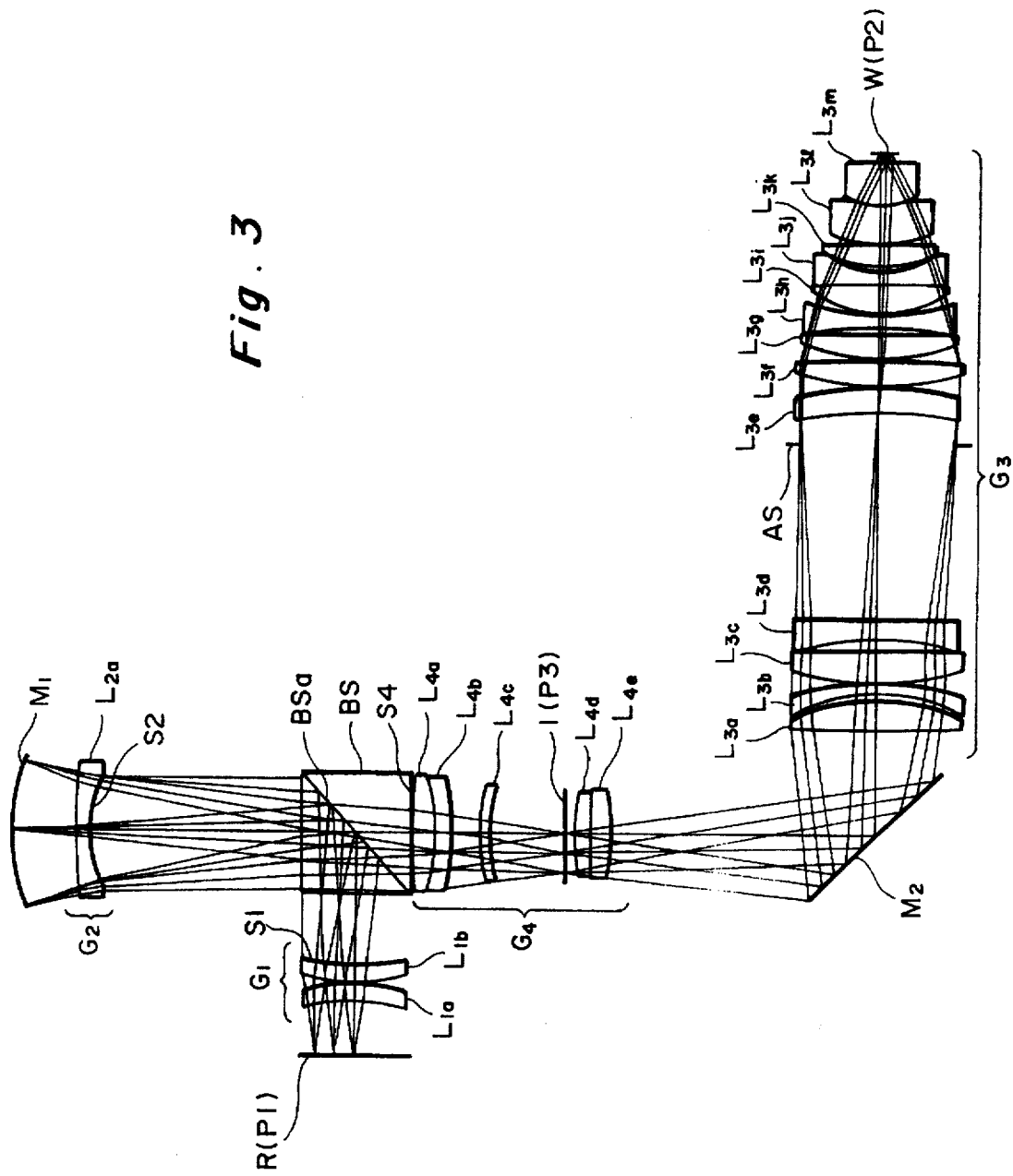
FIG. 3 is a view showing the arrangement of a catadioptric reduction projection optical system according to the first embodiment of the present invention.

In the catadioptric reduction projection optical system in FIG. 3 according to the first embodiment, a numerical aperture NA on the image side (i.e., a second object side or a wafer W side) is 0.6, a reduction magnification β of the overall system is +0.25, i.e., ¼ times, the diameter of an exposure area on a wafer W is 30.6 mm, and the light source 100 used in the illumination optical system IS in FIG. 1 comprises an excimer laser for supplying light having an exposure wavelength λ of 193.4±0.1 nm.

The detailed lens arrangement of the first embodiment will be described below. Referring to FIG. 3, a first lens group $G_1$ comprises a positive meniscus lens $L_{1a}$ with its concave surface facing the object side and a positive meniscus lens $L_{1b}$ with its convex surface facing the object side in an order from an object R to a beam splitter BS. A lens element $G_2$ comprises a negative meniscus lens $L_{2a}$ with its concave surface facing the beam splitter BS side. A fourth lens group $G_4$ comprises a biconvex positive lens $L_{4a}$ with its strong convex surface facing an optical path deflection mirror $M_2$ side, a negative meniscus lens $L_{4b}$ with its concave surface facing the beam splitter BS side, a negative meniscus lens $L_{4c}$ with its convex surface facing the beam splitter side, a negative meniscus lens $L_{4d}$ with its convex surface facing the beam splitter side, and a biconvex positive lens $L_{4e}$ in an order from the beam splitter BS to an optical path deflection mirror $M_2$. A third lens group $G_3$ included in the second partial optical system comprises a positive lens $L_{3a}$ with its strong convex surface facing the wafer W side, a negative meniscus lens $L_{3b}$ with its concave surface facing an optical path deflection mirror $M_2$ side, a positive meniscus lens $L_{3c}$ with its convex surface facing the optical path deflection mirror $M_2$ side, a biconcave negative lens $L_{3d}$ with its strong concave surface facing the optical path deflection mirror $M_2$ side, a positive meniscus lens $L_{3e}$ with its concave surface facing the optical path deflection mirror $M_2$ side, a biconvex positive lens $L_{3f}$ with its strong convex surface facing the optical path deflection mirror $M_2$ side, a plano-convex positive lens $L_{3g}$ with its strong surface facing the optical path deflection mirror $M_2$ side, a biconcave negative lens $L_{3h}$, a biconvex positive lens $L_{3i}$ with its strong convex surface facing the optical path deflection mirror $M_2$ side, a biconcave negative lens $L_{3j}$ with its strong concave surface facing the wafer W side, a plano-convex positive lens $L_{3k}$ with its strong convex surface facing the optical path deflection mirror $M_2$ side, a negative meniscus lens $L_{3l}$ with its concave surface facing the wafer W side, and a positive meniscus lens $L_{3m}$ with its convex surface facing the optical path deflection mirror $M_2$ side in an order from an optical deflection mirror $M_2$ to the wafer W.

In the first embodiment, an intermediate image I (primary image) of a reticle R is formed on a surface P3 between the negative meniscus lens $L_{4c}$ and the negative meniscus lens $L_{4d}$ of the fourth lens group $G_4$. In the first embodiment, an aperture stop AS is arranged in an optical path between the biconcave negative lens $L_{3d}$ and the positive meniscus lens $L_{3e}$.

Second Embodiment

Figure 4:
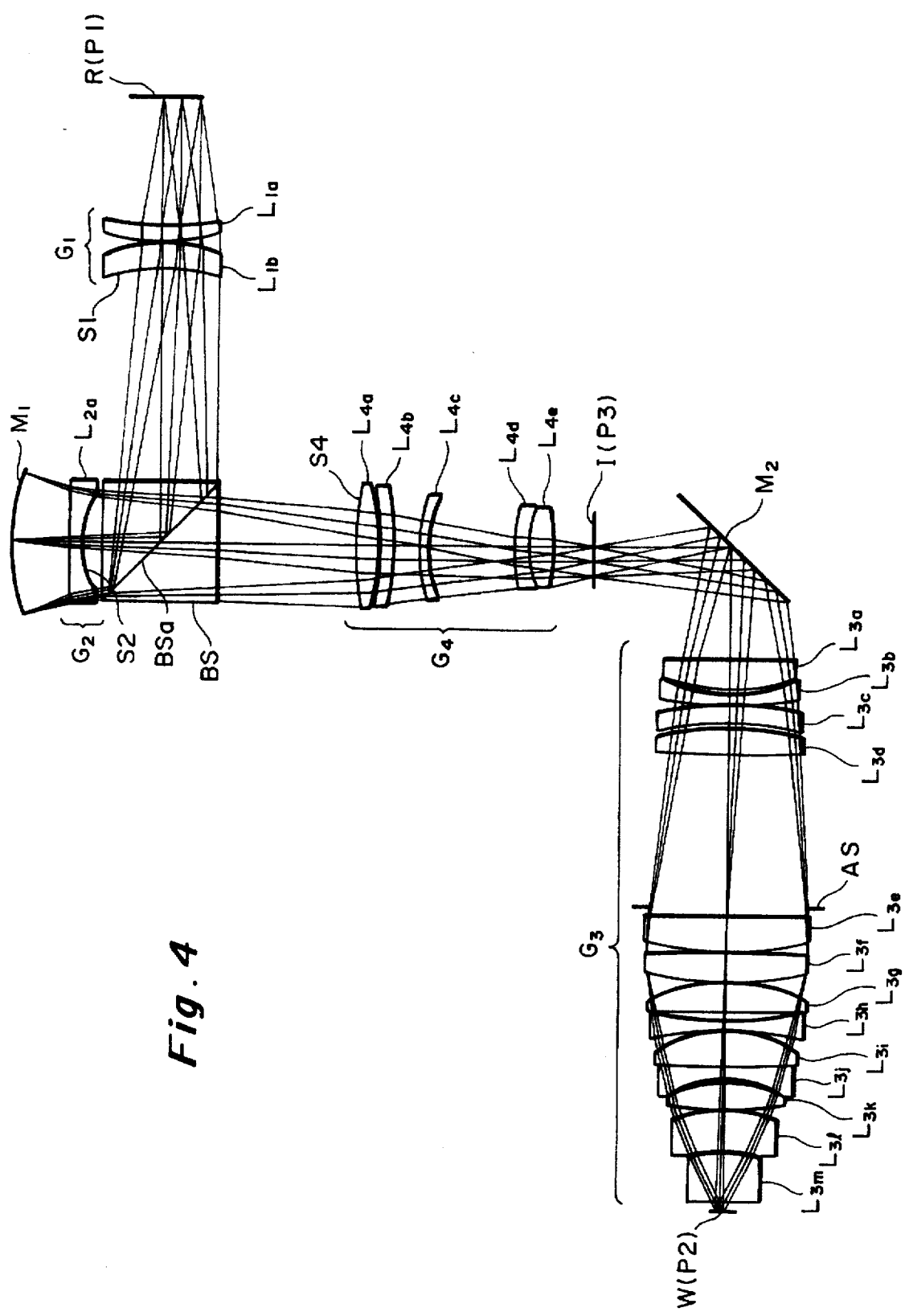
FIG. 4 is a view showing the arrangement of a catadioptric reduction projection optical system according to the second embodiment of the present invention.

In the catadioptric reduction projection optical system in FIG. 4 according to the second embodiment, a numerical aperture NA on the image side (i.e., a second object side or a wafer W side) is 0.6, a reduction magnification β of the overall system is +0.25, i.e., ¼ times, the diameter of an exposure area on a wafer W is 30.6 mm, and the light source 100 used in the illumination optical system IS in FIG. 1 comprises an excimer laser for supplying light having an exposure wavelength λ of 193.4±0.1 nm.

The detailed lens arrangement of the second embodiment will be described below. Referring to FIG. 4, a first lens group $G_1$ comprises a positive meniscus lens $L_{1a}$ with its concave surface facing a reticle R side and a positive meniscus lens $L_{1b}$ with its convex surface facing the reticle R side in an order from a reticle R to a beam splitter BS. A lens element comprises a negative meniscus lens $L_{2a}$ with its concave surface facing the beam splitter BS side. A fourth lens group $G_4$ comprises a biconvex positive lens $L_{4a}$, a negative meniscus lens $L_{4b}$ with its concave surface facing the beam splitter BS side, a negative meniscus lens $L_{4c}$ with its convex surface facing the beam splitter side, a negative meniscus lens $L_{4d}$ with its convex surface facing the beam splitter BS side, and a biconvex positive lens $L_{4e}$ with its strong convex surface facing the beam splitter side in an order from the beam splitter BS to an optical path deflection mirror $M_2$.

A third lens group $G_3$ included in the second partial optical system comprises a positive meniscus lens $L_{3a}$ with its convex surface facing the wafer W side, a negative meniscus lens $L_{3b}$ with its concave surface facing an optical path deflection mirror $M_2$ side, a negative meniscus lens $L_{3c}$ with its convex surface facing the optical path deflection mirror $M_2$ side, a biconvex positive lens $L_{3d}$ with its strong convex surface facing the wafer W side, a plano-convex positive lens $L_{3e}$ with its strong convex surface facing the wafer W side, a plano-convex positive lens $L_{3f}$ with its strong convex surface facing the wafer W side, a biconvex positive lens $L_{3g}$ with its strong convex surface facing the optical path deflection mirror $M_2$ side, a biconcave negative lens $L_{3h}$, a biconvex positive lens $L_{3i}$ with its strong convex surface facing the optical path deflection mirror $M_2$ side, a biconcave negative lens $L_{3j}$ with its strong concave surface facing the wafer W side, a biconvex positive lens $L_{3k}$ with its strong convex surface facing the optical path deflection mirror $M_2$ side, a positive meniscus lens $L_{3l}$ with its concave surface facing the wafer W side, and a biconvex positive lens $L_{3m}$ with its strong convex surface facing the optical path deflection mirror $M_2$ side in an order from an optical deflection mirror $M_2$ to the wafer W.

In the second embodiment, an intermediate image I (primary image) of a reticle R is formed on a surface P3 between the third lens group $G_3$ and the fourth lens group $G_4$, i.e., between the biconvex positive lens $L_{4e}$ and the optical path deflection mirror $M_2$. In the first embodiment, an aperture stop AS is arranged in an optical path between the biconvex positive lens $L_{3d}$ and the plano-convex positive meniscus lens $L_{3e}$.

Third Embodiment

Figure 5:
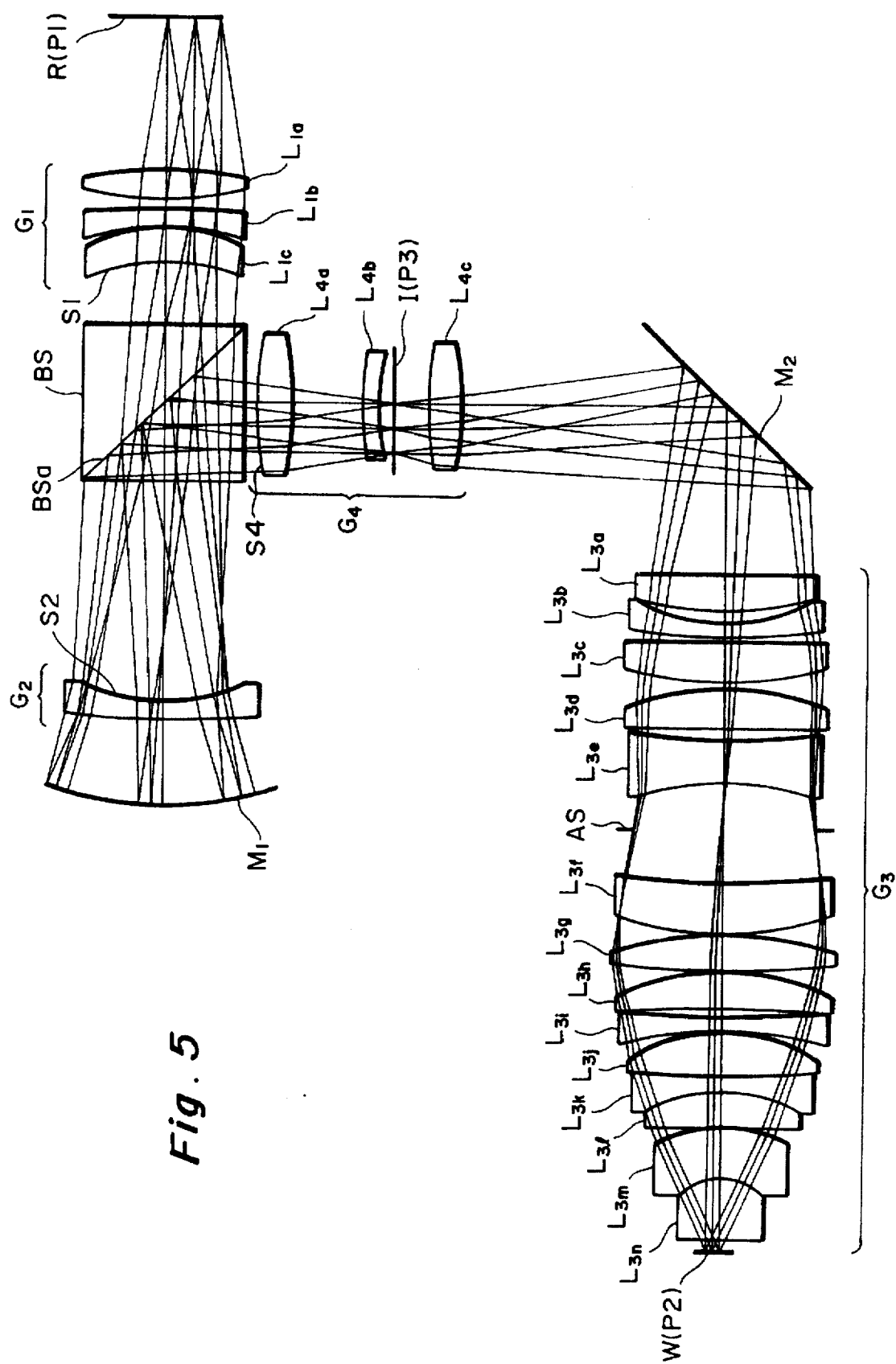
FIG. 5 is a view showing the arrangement of a catadioptric reduction projection optical system according to the third embodiment of the present invention.

In the catadioptric reduction projection optical system in FIG. 5 according to the third embodiment, a numerical aperture NA on the image side (i.e., a second object side or a wafer W side) is 0.6, a reduction magnification β of the overall system is +0.25, i.e., ¼ times, the diameter of an exposure area on a wafer W is 30.6 mm, and the light source 100 used in the illumination optical system IS in FIG. 1 comprises an excimer laser for supplying light having an exposure wavelength λ of 193.4 nm.

The catadioptric reduction projection optical system of the third embodiment is different from those of the first and second embodiments. Light from a uniformly illuminated reticle R (object surface P1) passes through a first lens group $G_1$ and then a beam splitter BS, and the light reaches a concave reflecting mirror $M_1$ through a lens element $G_2$. Light reflected by the concave reflecting mirror $M_1$ passes though the lens element $G_2$ again and is reflected by a light splitting surface BSa of the beam splitter BS. The reflected light passes through a fourth lens group $G_4$ and is deflected by an optical path deflection mirror $M_2$. The deflected light passes through a third lens group $G_3$. The light from the third lens group $G_3$ is focused to form a reduced image (secondary image) of the reticle R on the surface (image surface P2) of a wafer W.

The detailed lens arrangement of the third embodiment will be described below. As shown in FIG. 5, the first lens group $G_1$ comprises a biconvex positive lens $L_{1a}$, a negative meniscus lens $L_{1b}$ with its convex lens faces the reticle R side, and a positive meniscus lens $L_{1c}$ with its convex surface facing the reticle R side in an order from the reticle R to the beam splitter BS. The lens element $G_2$ comprises a negative meniscus lens $L_{2a}$ with its concave surface facing the beam splitter BS side.

The fourth lens group $G_4$ comprises a biconvex positive lens $L_{4a}$, a negative meniscus lens $L_{4b}$ with its convex surface facing the beam splitter BS side, and a biconvex positive lens $L_{4c}$ with its strong convex surface facing an optical path deflection mirror $M_2$ side in an order from the beam splitter BS to an optical path deflection mirror $M_2$. The third lens group $G_3$ included in the second partial optical system comprises a biconvex positive lens $L_{3a}$ with its strong convex surface facing the wafer W side, a negative meniscus lens $L_{3b}$ with its concave surface facing the optical path deflection mirror $M_2$ side, a biconvex positive lens $L_{3c}$ with its strong convex surface facing the wafer W side, a biconcave positive lens $L_{3d}$ with its strong convex surface facing the optical path deflection mirror $M_2$ side, a biconcave negative lens $L_{3e}$, a positive meniscus lens $L_{3f}$ with its concave surface facing the optical path deflection mirror $M_2$ side, a biconvex positive lens $L_{3g}$ with its strong convex surface facing the optical path deflection mirror $M_2$ side, a positive meniscus lens $L_{3h}$ with its convex surface facing the optical path deflection mirror $M_2$ side, a biconcave negative lens $L_{3i}$ with its strong concave surface facing the wafer W side, a biconvex positive lens $L_{3j}$ with its strong convex surface facing the optical path deflection mirror $M_2$ side, a biconcave negative lens $L_{3k}$ with its strong concave surface facing the wafer W side, a positive meniscus lens $L_{3l}$ with its convex surface facing the optical path deflection mirror $M_2$ side, a negative meniscus lens $L_{3m}$ with its concave surface facing the wafer W side, and a positive meniscus lens $L_{3n}$ with its convex surface facing the optical path deflection mirror $M_2$ side in an order from the optical path deflection mirror $M_2$ to the wafer W.

In the third embodiment, an intermediate image I (primary image) of the reticle R is formed on a surface P3 between the negative meniscus lens $L_{4b}$ and the positive lens $L_{4c}$ of the fourth lens group $G_4$. In this embodiment, an aperture stop AS is arranged in the optical path between the biconcave negative lens $L_{3e}$ and the positive meniscus lens $L_{3f}$.

The specification values and condition correspondence values of the first to third embodiments are summarized in Tables 1 to 3. Radii r of curvature of the respective surfaces, surface-to-surface distances, and glass materials from the reticle R (first object) serving as the object surface P1 to the wafer W (second object) serving as the image surface P2 are shown in Tables 1 to 3. In Table 1, the sign of the radius r of curvature of each surface is positive when a convex surface faces the reticle R side in an optical path extending from the reticle R to the concave reflecting mirror $M_1$. The sign is inverted in an optical path extending from the concave reflecting mirror $M_1$ to the wafer W. The sign of the surface-to-surface distance d is positive in an optical path extending from the reticle R to the concave reflecting mirror $M_1$ and is inverted in an optical path extending from the concave reflecting mirror $M_1$ to the wafer W.

In Tables 1 to 3, NA represents the numerical aperture (image-side numerical aperture) on the wafer W side; d0, a distance from the reticle R (object side) to the lens surface (first lens surface) of the first lens group $G_1$ which is closest to the reticle R side (object side); WD, a distance (working distance) from the lens surface of the fourth lens group $G_4$ which is closest to the wafer W side (image side) to the wafer W (image surface); β, the reduction magnification of the overall system; $β_{PI}$, the transverse magnification of the intermediate image I; $β_{M1}$, the transverse magnification of the concave reflecting mirror $M_1$; and $f_{G2}$, the focal length of the lens element $G_2$. Note that $CaF_2$ and $SiO_2$ represent fluorite and silica glass as glass materials in Tables 1 to 3. The refractive indices of silica glass and fluorite at the fundamental wavelength (ArF excimer laser wavelength: λ=193.4 nm) are as follows:

Silica glass ($SiO_2$): 1.56019

Fluorite ($CaF_2$): 1.50138

Note that the position of the optical path deflection mirror $M_2$ is not essential in optical design and is omitted in Tables 1 to 3.

TABLE 1

Specifications of First Embodiment

NA = 0.6
d0 = 79.857
WD = −15.333

| No. | r | d | Glass Material | Element No. |
|---|---|---|---|---|
| 1 | −311.138 | 27.000 | SiO2 | L1a |
| 2 | −271.921 | 0.500 | | |
| 3 | 237.260 | 30.000 | CaF2 | L1b |
| 4 | 610.698 | 117.712 | | |
| 5 | 0.000 | 170.000 | SiO2 | BS |
| 6 | 0.000 | 314.541 | | |
| 7 | −201.381 | 20.000 | SiO2 | L2a |
| 8 | −994.854 | 94.340 | | |
| 9 | −381.239 | −94.340 | | M1 |

TABLE 1-continued

Specifications of First Embodiment

NA = 0.6
d0 = 79.857
WD = −15.333

| No. | r | d | Glass Material | Element No. |
|---|---|---|---|---|
| 10 | −994.854 | −20.000 | SiO2 | L2a |
| 11 | −201.381 | −314.541 | | |
| 12 | 0.000 | −170.000 | SiO2 | BS |
| 13 | 0.000 | −2.218 | | |
| 14 | −1206.774 | −35.000 | CaF2 | L4a |
| 15 | 297.899 | −5.000 | | |
| 16 | 285.664 | −20.000 | SiO2 | L4b |
| 17 | 375.528 | −44.302 | | |
| 18 | −378.397 | −15.000 | SiO2 | L4c |
| 19 | −282.214 | −134.601 | | |
| 20 | −516.078 | −20.000 | SiO2 | L4d |
| 21 | −371.665 | −5.000 | | |
| 22 | −585.552 | −30.000 | CaF2 | L4e |
| 23 | 627.032 | −562.158 | | |
| 24 | −2779.3 | −45.600 | CaF2 | L3a |
| 25 | 298.390 | −12.000 | | |
| 26 | 263.463 | −17.100 | SiO2 | L3b |
| 27 | 369.388 | −0.570 | | |
| 28 | −477.301 | −45.600 | SiO2 | L3c |
| 29 | −3437.574 | −20.000 | | |
| 30 | 443.088 | −29.667 | SiO2 | L3d |
| 31 | −8075.675 | −276.226 | | |
| 32 | 0.000 | −47.749 | | AS |
| 33 | 1076.200 | −39.937 | SiO2 | L3e |
| 34 | 458.143 | −1.140 | | |
| 35 | −337.836 | −39.900 | CaF2 | L3f |
| 36 | 1801.600 | −0.570 | | |
| 37 | −290.085 | −40.000 | CaF2 | L3g |
| 38 | 28919.470 | −9.600 | | |
| 39 | 801.910 | −19.000 | SiO2 | L3h |
| 40 | −321.339 | −0.570 | | |
| 41 | −156.673 | −47.500 | CaF2 | L3i |
| 42 | 2500.000 | −1.140 | | |
| 43 | 2000.000 | −19.000 | SiO2 | L3j |
| 44 | −136.158 | −11.000 | | |
| 45 | −198.569 | −30.000 | SiO2 | L3k |
| 46 | −11265.580 | −0.570 | | |
| 47 | −175.348 | −57.000 | SiO2 | L3l |
| 48 | −113.028 | −4.000 | | |
| 49 | −100.548 | −68.400 | SiO2 | L3m |
| 50 | −5285.724 | (WD) | | |

Condition Correspondence Values of First Embodiment

βPI/β = −3.656
βM1/β = −3.969
f G2 = −454.552

TABLE 2

Specifications of Second Embodiment

NA = 0.6
d0 = 206.194
WD = −15.333

| No. | r | d | Glass Material | Element No. |
|---|---|---|---|---|
| 1 | −730.441 | 30.000 | SiO2 | L1a |
| 2 | −302.928 | 4.657 | | |
| 3 | 265.869 | 40.000 | SiO2 | L1b |
| 4 | 305.215 | 373.987 | | |
| 5 | 0.000 | 190.000 | SiO2 | BS |
| 6 | 0.000 | 35.128 | | |
| 7 | −194.144 | 20.000 | SiO2 | L2a |
| 8 | −1440.408 | 94.762 | | |
| 9 | −387.896 | −94.762 | | M1 |
| 10 | −1440.408 | −20.000 | SiO2 | L2a |
| 11 | −194.144 | −35.128 | | |
| 12 | 0.000 | −190.000 | SiO2 | BS |
| 13 | 0.000 | −236.433 | | |

TABLE 2-continued

Specifications of Second Embodiment

NA = 0.6
d0 = 206.194
WD = −15.333

| No. | r | d | Glass Material | Element No. |
|---|---|---|---|---|
| 14 | −607.213 | −35.000 | CaF2 | L4a |
| 15 | 430.362 | −5.000 | | |
| 16 | 670.375 | −20.000 | SiO2 | L4b |
| 17 | 888.244 | −44.811 | | |
| 18 | −299.512 | −15.000 | SiO2 | L4c |
| 19 | −214.161 | −148.534 | | |
| 20 | −485.840 | −20.000 | SiO2 | L4d |
| 21 | −207.182 | −5.000 | | |
| 22 | −209.670 | −35.000 | CaF2 | L4e |
| 23 | 551.618 | −491.952 | | |
| 24 | 4130.370 | −45.600 | SiO2 | L3a |
| 25 | 362.364 | −12.000 | | |
| 26 | 248.616 | −17.100 | SiO2 | L3b |
| 27 | 662.143 | −0.570 | | |
| 28 | −706.743 | −30.000 | SiO2 | L3c |
| 29 | −422.409 | −10.000 | | |
| 30 | −481.701 | −45.985 | CaF2 | L3d |
| 31 | 1521.700 | −265.591 | | |
| 32 | 0.000 | −10.919 | | AS |
| 33 | −7977.613 | −60.000 | SiO2 | L3e |
| 34 | 574.523 | −1.368 | | |
| 35 | −4657.727 | −47.880 | SiO2 | L3f |
| 36 | 716.625 | −0.684 | | |
| 37 | −277.940 | −52.000 | CaF2 | L3g |
| 38 | 3179.880 | −10.320 | | |
| 39 | 667.602 | −20.000 | SiO2 | L3h |
| 40 | −468.367 | −0.684 | | |
| 41 | −209.087 | −57.000 | CaF2 | L3i |
| 42 | 7010.900 | −4.170 | | |
| 43 | 1426.600 | −20.000 | SiO2 | L3j |
| 44 | −180.418 | −4.800 | | |
| 45 | −208.577 | −44.400 | CaF2 | L3k |
| 46 | 712.163 | −0.684 | | |
| 47 | −207.093 | −68.400 | SiO2 | L3l |
| 48 | −213.466 | −4.800 | | |
| 49 | −172.836 | −82.080 | CaF2 | L3m |
| 50 | 1159.260 | (WD) | | |

Condition Correspondence Values of Second Embodiment

ββPI/β = −3.411
=βM1/β = −4.045
f G2 = −402.876

TABLE 3

Specifications of Third Embodiment

NA = 0.6
d0 = 173.320
WD = −11.333

| No. | r | d | Glass Material | Element No. |
|---|---|---|---|---|
| 1 | 581.368 | 30.000 | SiO2 | L1a |
| 2 | −391.135 | 11.360 | | |
| 3 | 924.600 | 20.000 | SiO2 | L1b |
| 4 | 269.179 | 0.746 | | |
| 5 | 175.001 | 40.000 | SiO2 | L1c |
| 6 | 241.476 | 70.301 | | |
| 7 | 0.000 | 180.000 | SiO2 | BS |
| 8 | 0.000 | 254.826 | | |
| 9 | −207.288 | 20.000 | SiO2 | L2a |
| 10 | −797.747 | 97.963 | | |
| 11 | −393.360 | −97.963 | | M1 |
| 12 | −797.747 | −20.000 | SiO2 | L2a |
| 13 | −207.288 | −254.826 | | |
| 14 | 0.000 | −180.000 | SiO2 | BS |
| 15 | 0.000 | −16.169 | | |
| 16 | −700.885 | −35.000 | SiO2 | L4a |
| 17 | 722.684 | −83.129 | | |

TABLE 3-continued

Specifications of Third Embodiment

NA = 0.6
d0 = 173.320
WD = −11.333

| No. | r | d | Glass Material | Element No. |
|---|---|---|---|---|
| 18 | −514.396 | −15.000 | SiO2 | L4b |
| 19 | −240.329 | −60.245 | | |
| 20 | −919.660 | −35.000 | SiO2 | L4c |
| 21 | 352.479 | −491.844 | | |
| 22 | −4123.923 | −40.000 | CaF2 | L3a |
| 23 | 355.068 | −15.767 | | |
| 24 | 193.083 | −17.100 | SiO2 | L3b |
| 25 | 651.781 | −4.199 | | |
| 26 | −3560.029 | −45.600 | CaF2 | L3c |
| 27 | 435.428 | −10.020 | | |
| 28 | −325.006 | −45.600 | CaF2 | L3d |
| 29 | 2283.310 | −12.525 | | |
| 30 | 677.099 | −50.000 | SiO2 | L3e |
| 31 | −327.839 | −52.774 | | |
| 32 | 0.000 | −62.953 | | AS |
| 33 | 897.654 | −57.000 | SiO2 | L3f |
| 34 | 344.802 | −1.140 | | |
| 35 | −393.740 | −39.900 | CaF2 | L3g |
| 36 | 1030.220 | −0.570 | | |
| 37 | −259.990 | −40.000 | CaF2 | L3h |
| 38 | −1505.829 | −8.000 | | |
| 39 | 3309.440 | −17.000 | SiO2 | L3i |
| 40 | −396.541 | −0.570 | | |
| 41 | −170.438 | −47.500 | CaF2 | L3j |
| 42 | 3070.940 | −3.140 | | |
| 43 | 1740.290 | −17.000 | SiO2 | L3k |
| 44 | −156.254 | −2.000 | | |
| 45 | −162.182 | −40.000 | CaF2 | L3l |
| 46 | −914.393 | −0.570 | | |
| 47 | −152.174 | −57.000 | SiO2 | L3m |
| 48 | −63.377 | −2.850 | | |
| 49 | −65.057 | −68.400 | SiO2 | L3n |
| 50 | −615.935 | (WD) | | |

Condition Correspondence Values of Third Embodiment
$\beta PI/\beta = -3.554$
$\beta M1/\beta = -3.604$
f G2=−506.087

Figure 6:
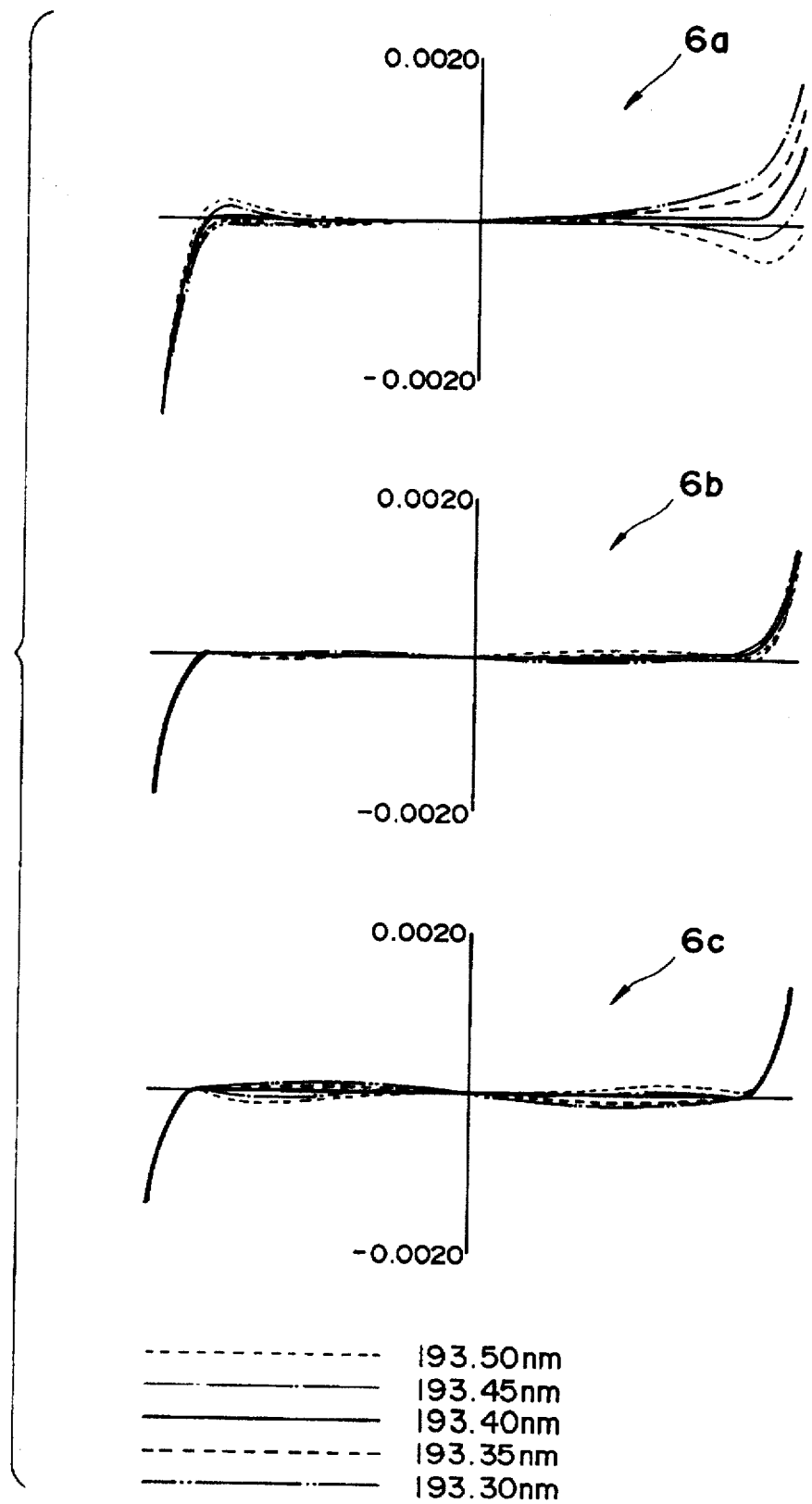
FIG. 6 is a graph showing comas of the catadioptric reduction projection optical system (first embodiment) shown in FIG. 3, in which a coma 6a in the upper portion is caused by a 100% image height, a coma 6b in the middle portion is caused by a 50% image height, and a coma 6c in the lower portion is caused by a 0% image height.
Figure 7:
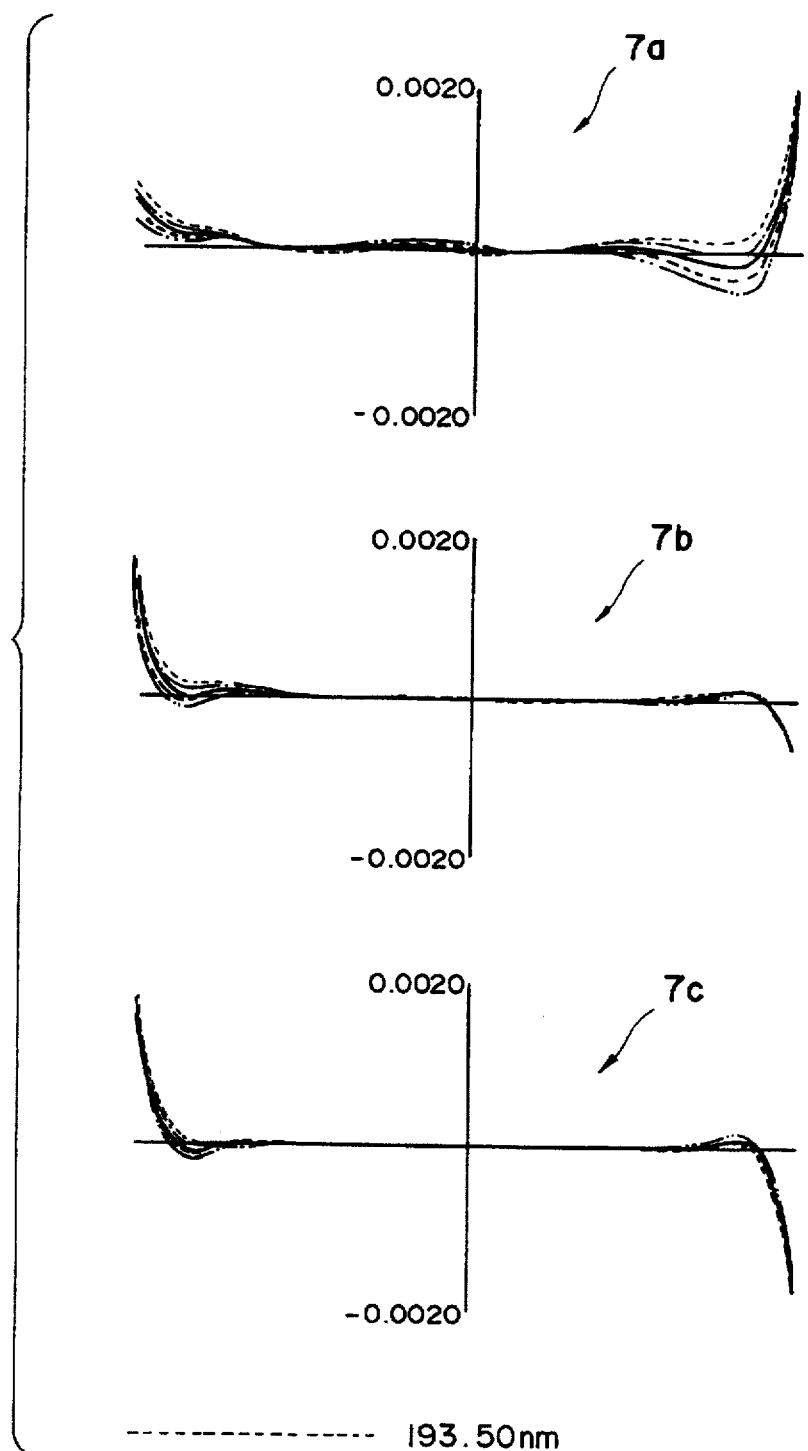
FIG. 7 is a graph showing comas of the catadioptric reduction projection optical system (second embodiment) shown in FIG. 4, in which a coma 7a in the upper portion is caused by a 100% image height, a coma 7b in the middle portion is caused by a 50% image height, and a coma 7c in the lower portion is caused by a 0% image height.
Figure 8:
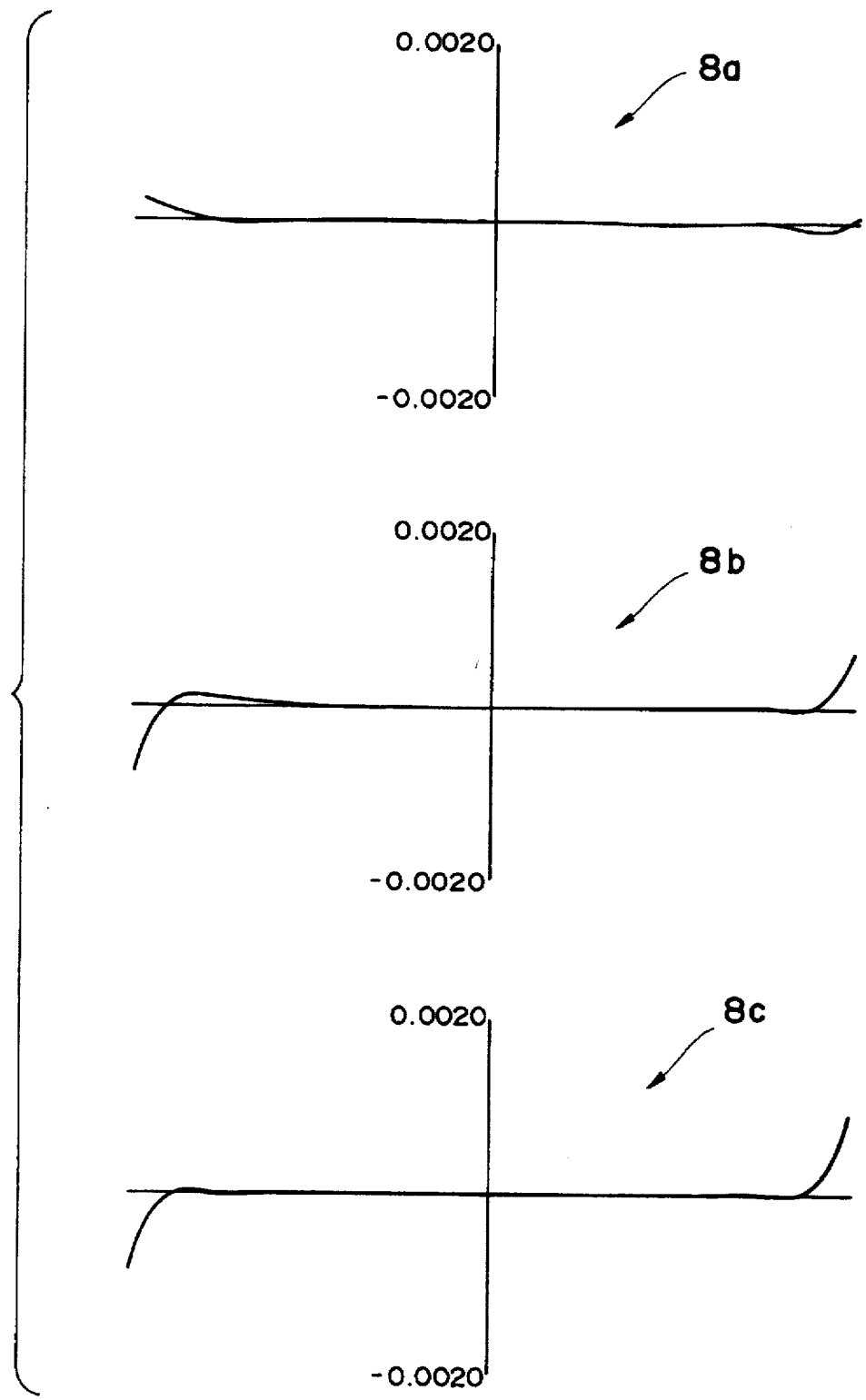
FIG. 8 is a graph showing comas of the catadioptric reduction projection optical system (third embodiment) shown in FIG. 5, in which a coma 8a in the upper portion is caused by a 100% image height, a coma 8b in the middle portion is caused by a 50% image height, and a coma 8c in the lower portion is caused by a 0% image height.

The comas of the first, second, and third embodiments are shown in FIGS. 6, 7, and 8, respectively. In this case, 6a in FIG. 6, 7a in FIG. 7, and 8a in FIG. 8 show transverse comas at a 100% image height (i.e., an image height of 15.3 mm); 6b in FIG. 6, 7b in FIG. 7, and 8b in FIG. 8 show transverse comas at a 50% image height (i.e., an image height of 7.65 mm); and 6c in FIG. 6, 7c in FIG. 7, and 8c in FIG. 8 show transverse comas at a 0% image height (i.e., an image height of 0.0 mm). Note that solid lines in each figure represent comas at the fundamental wavelength ($\lambda$=193.4 nm), dotted lines represent comas at a wavelength $\lambda$=193.5 nm, chain lines represent comas at a wavelength $\lambda$=193.45 nm, broken lines represent comas at a wavelength $\lambda$=193.35 nm, and chain double-dashed lines represent comas at a wavelength $\lambda$=193.3 nm.

The catadioptric reduction projection optical systems of the embodiments can properly correct aberrations and are excellent in imaging performance while maintaining very large numerical aperture N.A.=0.6, as can be apparent from the comas in FIGS. 6, 7, and 8.

In addition, the catadioptric reduction projection optical systems of the first embodiment (FIG. 3) and the second embodiment (FIG. 4) can properly correct chromatic aberrations within the range of 193.4 mn±0.1 nm.

In each embodiment described above, a polarizing beam splitter PBS may be used in place of the beam splitter BS, and a $\lambda$/4 plate may be arranged in the optical path between the beam splitter BS and the concave reflecting mirror $M_1$. More specifically, the illumination optical system IS for uniformly illuminating the reticle R placed on the reticle stage RS illuminates an object with linearly polarized light having a predetermined oscillation surface. The linearly polarized light through the reticle R passes through the first lens group $G_1$ and reaches the polarizing beam splitter PBS.

The polarizing beam splitter PBS has a polarizing splitting film on a direction change surface PBSa. In an exposure apparatus shown in FIG. 9, the illumination optical system IS supplies linearly polarized light serving as a P-polarized component for the polarization splitting film. The linearly polarized light from the first lens group $G_1$ passes through the polarizing beam splitter PBS and a $\lambda$/4 plate QW located on its exit side, and is then converted into circularly polarized light. This circularly polarized light passes through the lens element $G_2$ and is reflected by the concave reflecting mirror $M_1$. The reflected light passes through the lens element $G_2$ and the $\lambda$/4 plate QW again and is converted into linearly polarized light serving as an S-polarized component for the polarization splitting film. This linearly polarized light is reflected by the splitting surface PBSa of the polarizing beam splitter PBS and is then incident on the fourth lens group $G_4$. In the embodiment shown in FIG. 9, an intermediate image I (primary image) of the reticle R is formed on the surface P3 by the first and lens element $G_1$ and $G_2$, the concave reflecting mirror $M_1$, and the polarizing beam splitter PBS.

The linearly polarized light from the intermediate image I on the surface P3 emerges from the fourth lens group $G_4$ as in the exposure apparatus shown in FIG. 1. The light passes through the optical path deflection mirror $M_2$ and the third lens group $G_3$ included in the second partial optical system in the order named, and a reduced image (secondary image) of the reticle R is formed on the surface (image surface P2) of the wafer W (second object) placed on the wafer stage WS. With this arrangement, a sufficiently high illuminance can be obtained on the wafer W (image surface P2), and a high throughput can be obtained. With this arrangement, flare can also be prevented, and an exposure apparatus capable of obtaining an image having a high contract can be provided.

Figure 9:
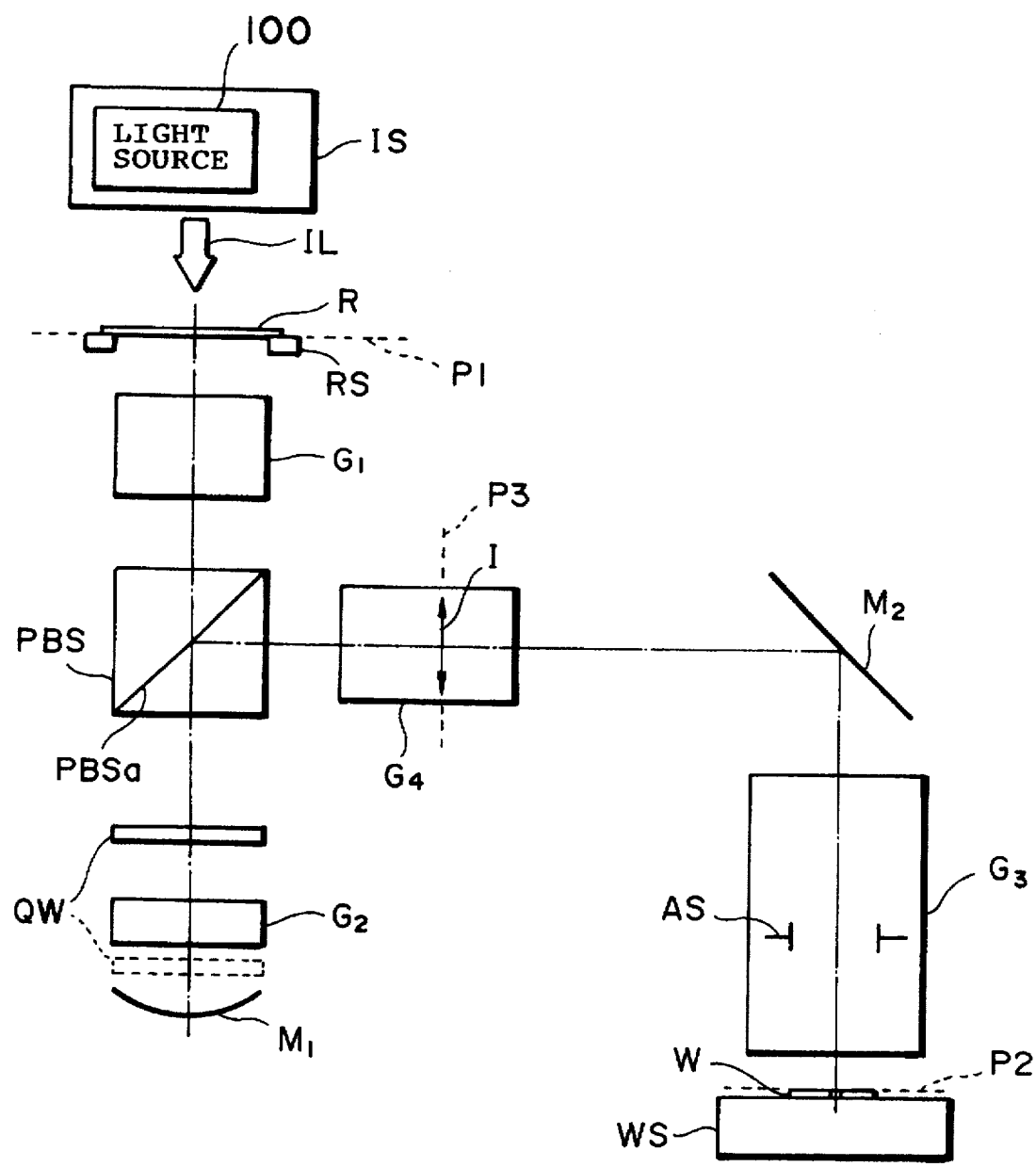
FIG. 9 is a view showing the schematic arrangement of another exposure apparatus which can employ the catadioptric reduction projection optical system according to the present invention.

In the embodiment shown in FIG. 9, the $\lambda$/4 plate QW is arranged in the optical path between the polarizing beam splitter PBS and the lens element $G_2$. However, the $\lambda$/4 plate QW may be arranged at a position indicated by the broken line, i.e., in an optical path between the lens element $G_2$ and the concave reflecting mirror $M_1$. In addition, the beam splitter BS in the exposure apparatus in FIG. 1 may be replaced with a polarizing beam splitter, and a $\lambda$/4 plate may be arranged between the polarizing beam splitter and the concave reflecting mirror $M_1$.

The reflection/refraction reduction projection optical system of each embodiment can also be applied to an exposure apparatus employing any one of the one-shot and scanning exposure systems described above. For example, in a one-shot exposure system, exposure is performed while the reticle stage RS and the wafer stage WS are kept fixed. In a scanning exposure system, exposure is performed while the reticle stage RS and the wafer stage WS in FIG. 1 or 9 are kept moved in the lateral direction. When a scanning exposure system is employed, an illumination area of the illumination optical system IS is preferably constituted by a slit extending in a direction perpendicular to the drawing surface. In addition, a field stop is preferably arranged at the position of the intermediate image I.

As has been described above, according to the present invention, a large numerical aperture can be obtained while the beam splitter is kept relatively small. Excellent performance of a semiconductor manufacturing apparatus can be achieved.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 7-012502 (012502/1995) filed on Jan. 30, 1995 is hereby incorporated by reference.

What is claimed is:

1. A catadioptric reduction projection optical system for projecting a reduced image of a first object onto a second object, comprising:

a first partial optical system for forming an intermediate image of the first object, said first partial optical system having a first lens group, a beam splitter, a lens element, and a concave reflecting mirror such that light from the first object is sequentially guided to said concave reflecting mirror through said first lens group, said beam splitter, and said lens element in an order named, and light reflected by said concave reflecting mirror passes through said lens element and said beam splitter in an order named, thereby forming the intermediate image;

a second partial optical system for forming a reduced image of the intermediate image on the second object, said second partial optical system having a second lens group of a positive refracting power and arranged in an optical path between the second object and a surface on which the intermediate image is formed by said first partial optical system; and a third lens group arranged in an optical path between said beam splitter of said first partial optical system and said second lens group of said second partial optical system.

2. A system according to claim 1, wherein said first lens group is arranged in an optical path between the first object and said beam splitter, and wherein said lens element has a negative lens component having a concave surface facing said beam splitter.

3. A system according to claim 1, wherein said first lens group is arranged in an optical path between the first object and said beam splitter, and wherein a lens surface of said first lens group, being closest to said beam splitter, has a concave shape with respect to said beam splitter.

4. A system according to claim 1, wherein at least a part of said third lens group is arranged in an optical path between said beam splitter and the surface on which the intermediate image is formed by said first partial optical system.

5. A system according to claim 4, wherein said whole third lens group is arranged in an optical path between said beam splitter and the surface on which the intermediate image is formed.

6. A system according to claim 4, wherein the surface on which the intermediate image is formed is formed between a lens surface of said third lens group which is closest to said beam splitter and a lens surface of said third lens group which is closest to said second partial optical system.

7. A system according to claim 1, wherein said catadioptric reduction projection optical system satisfies the following condition:

$$-4.0 < \beta_{PI}/\beta < -2.5$$

where $\beta$ is the total reduction magnification and $\beta_{PI}$ is the transverse magnification of the intermediate image.

8. A system according to claim 1, wherein said catadioptric reduction projection optical system satisfies the following conditions:

$$-4.1 < \beta_{MI}/\beta < -2.8$$

where $\beta$ is the total reduction magnification and $\beta_{MI}$ is the transverse magnification of said concave reflecting mirror.

9. A system according to claim 1, wherein said third lens group has a positive refracting power.

10. A system according to claim 1, wherein said first lens group has a positive refracting power.

11. A system according to claim 1, wherein said second lens group has an aperture stop.

12. A system according to claim 1, wherein each optical member constituting each of said first lens group, said lens element, said second lens group, and said third lens group essentially consists of a material selected from one of silica glass and fluorite.

13. A system according to claim 12, wherein each of said first lens group, said lens element, said second lens group and said third lens group comprises at least one optical member consisting of fluorite.

14. An exposure apparatus comprising:

a first stage allowing a photosensitive substrate to be held on a main surface thereof;

a second stage for holding a mask having a predetermined pattern;

an illumination optical system for emitting exposure light having a predetermined wavelength onto said mask and transferring the pattern of said mask onto said substrate; and a catadioptric reduction projection optical system, arranged between said first and second stages, for projecting a reduced image of the pattern of said mask onto said substrate, said catadioptric reduction projection optical system comprising a first partial optical system for forming an intermediate image of the first object, said first partial optical system having a first lens group, a beam splitter, a lens element, and a concave reflecting mirror such that light from the mask is sequentially guided to said concave reflecting mirror through said first lens group, said beam splitter, and said lens element in an order named, and light reflected by said concave reflecting mirror passes through said lens element and said beam splitter in an order named, thereby forming the intermediate image, a second partial optical system for forming a reduced image of the intermediate image on the substrate, said second partial optical system having a second lens group of a positive refracting power and arranged in an optical path between the substrate and a surface on which the intermediate image is formed by said first partial optical system, and a third lens group arranged in an optical path between said beam splitter of said first partial optical system and said second lens group of said partial optical system.

15. An apparatus according to claim 14, wherein, in said catadioptric reduction projection optical system, said first lens group is arranged in an optical path between the mask and said beam splitter, and wherein said lens element has a negative lens component having a concave surface facing said beam splitter.

16. An apparatus according to claim 14, wherein, in said catadioptric reduction projection optical system, said first lens group is arranged in an optical path between the mask and said beam splitter, and wherein a lens surface of said first lens group, being closest to said beam splitter, has a concave shape with respect to said beam splitter.

17. An apparatus according to claim 14, wherein, in said catadioptric reduction projection optical system, at least a part of said third lens group is arranged in an optical path between said beam splitter and the surface on which the intermediate image is formed by said first partial optical system.

18. An apparatus according to claim 17, wherein, in said catadioptric reduction projection optical system, said whole third lens group is arranged in an optical path between said beam splitter and the surface on which the intermediate image is formed.

19. An apparatus according to claim 17, wherein the surface on which the intermediate image is formed is formed between a lens surface of said third lens group which is closest to said beam splitter and a lens surface of said third lens group which is closest to said second partial optical system.

20. An apparatus according to claim 14, wherein said catadioptric reduction projection optical system satisfies the following condition:

$$-4.0<\beta_{PI}/\beta<-2.5$$

where $\beta$ is the total reduction magnification and $\beta_{PI}$ is the transverse magnification of the intermediate image.

21. An apparatus according to claim 14, wherein said catadioptric reduction projection optical system satisfies the following condition:

$$-4.1<\beta_{MI}<-2.8$$

where $\beta$ is the total reduction magnification and $\beta_{MI}$ is the transverse magnification of said concave reflecting mirror.

22. An apparatus according to claim 14, wherein said illumination optical system includes an excimer laser.

* * * * *